United States Patent [19]
Shih et al.

[11] Patent Number: 5,969,563
[45] Date of Patent: Oct. 19, 1999

[54] INPUT AND OUTPUT CIRCUIT WITH WIDE VOLTAGE TOLERANCE

[75] Inventors: Chian-Gauh Shih, Hsinchu Hsien; Jiunn-Fu Liu, Hainchu; Yanan Mou, Hsinchu, all of Taiwan

[73] Assignee: United Microelectronics Corp., Hsinchu, Taiwan

[21] Appl. No.: 09/098,401

[22] Filed: Jun. 17, 1998

[30] Foreign Application Priority Data

Apr. 22, 1998 [TW] Taiwan .................................. 87106145

[51] Int. Cl.$^6$ ........................................................ H03L 5/00
[52] U.S. Cl. .............................. 327/333; 326/24; 326/81; 327/374; 327/379
[58] Field of Search ...................................... 327/333, 391, 327/437, 108, 112, 374, 376, 377, 379; 326/21, 24, 34, 80, 81, 83, 87

[56] References Cited

U.S. PATENT DOCUMENTS

| | | | |
|---|---|---|---|
| 4,833,349 | 5/1989 | Liu et al. | 326/50 |
| 5,111,076 | 5/1992 | Tarng | 326/27 |
| 5,381,062 | 1/1995 | Morris | 326/68 |
| 5,525,914 | 6/1996 | Cao et al. | 326/71 |
| 5,546,019 | 8/1996 | Liao | 326/81 |
| 5,760,634 | 6/1998 | Fu | 327/391 |

*Primary Examiner*—Timothy P. Callahan
*Assistant Examiner*—An T. Luu
*Attorney, Agent, or Firm*—Knobbe, Martens, Olson & Bear LLP

[57] ABSTRACT

An input/output circuit with wide voltage tolerance is using a feedback circuit for increasing the voltage tolerance. A single gate oxide structure is fabricated instead of a dual gate oxide structure.

4 Claims, 3 Drawing Sheets

5,969,563

INPUT AND OUTPUT CIRCUIT WITH WIDE VOLTAGE TOLERANCE

CROSS-REFERENCE TO RELATED APPLICATION

This application claims the priority benefit of Taiwan application Ser. No. 87106145, filed Apr. 22, 1998, the full disclosure of which is incorporated herein by reference.

BACKGROUND OF THE INVENTION

1. Field of the Invention

This invention relates to an input/output (I/O) circuit, and more particularly to using a feedback circuit in the I/O circuit to increase the I/O voltage tolerance.

2. Description of Related Art

An integrated circuit (IC) device includes a number of electronic elements such as resistors, capacitors, transistors and switches, which are made of semiconductor materials, such as silicon or gallium arsenide, and are fabricated together on a semiconductor substrate by fabricating technologies, such as photolithography, etching, chemical vapor deposition (CVD) and so on. The IC device including many electronic elements, therefore, appears in a size about 1~2 $cm^2$ with thickness about 1 mm.

Basically, any IC device is composed of a number of conductors, semiconductors and dielectrics, which are orderly formed together according to the circuit design. For example, a metal oxide semiconductor (MOS) device is composed of a metal layer, an oxide layer and a semiconductor layer, which are sequentially formed. When a bias is applied on the MOS device between the metal layer and the semiconductor layer, certain charges are stored on an interface, or called PN junction, between the oxide layer and the semiconductor layer. The MOS device behaves like a capacitor. If the applied bias keeps on increasing, the charge density is accordingly brought up and then reaches a critical density, which is high enough to invert the type of the semiconductor, such as a P-type semiconductor turns to an N-type semiconductor. This phenomenon is called inversion. A strong inversion can happen if the applied bias is higher than a threshold voltage. When a MOS device stays on the strong inversion situation, if there are another two side MOS devices with different semiconductor type separately located at the sides of the MOS device, these three MOS devices are then coupled together through an inversion layer of the MOS device. The inversion layer, which has the same semiconductor type as the side MOS devices, is resulted from the strong inversion to change the semiconductor type.

Thus, if the applied bias is higher than the threshold voltage, the IC device can normally work. If the applied bias is too high, which has cross over a breakdown voltage of the IC device, since load of the IC device is too high, the PN junction and the gate oxide of a MOS transistor can be damaged. A phenomenon of leakage current therefore can happen and, even more serious, the IC device could be burnt down.

For example, in an IC device using two voltage sources of 3.3 V and 5 V, if the IC device has one bus for common uses, the part of the IC device using the bias of 3.3 V should sense a stress induced by the bias of 5 V and get a result of damages on the output PN junction and the gate oxide. One conventional solution for this problem is forming a dual gate oxide instead of a single gate oxide to increase the breakdown voltage and further prolong the lifetime, which is the happening time of a time-dependent dielectric breakdown (TDDB). The TDDB is related to the IC reliability. However, although the dual gate oxide structure can solve the above problem, the fabricating costs are about 15% higher than the fabricating costs for a single gate oxide structure.

Another solution is done through a circuitry technology. FIG. 1 is a schematic conventional I/O circuit, which has been disclosed by AT&T in an U.S. Pat. No. 5,381,062, "MULTIVOLTAGE COMPATIABLE BIDIRECTIONAL BUFFER".

In FIG. 1, an output pad 10 is coupled to an output of a 5 V IC device 9. When the 5 V IC device 9 receives a driving voltage of 5 V from a 5 V-voltage source 8, an output the output pad 10 is driven by the 5 V IC device 9 and then provides a 5 V bias to the circuit. The circuit includes two PMOS transistors 11, 12 connected serially and two NMOS transistors 13, 14 connected serially. The gate of the PMOS transistor 11 is, for example, coupled to a driver output (not shown) through a node 15 and the gate of the NMOS transistor 14 is, for example, coupled to a driver output (not shown) through a node 16. The nodes 15, 16 are used to control the output levels to be either "high" or "low", which determine the "ON" or "OFF" statuses of the PMOS transistor 11 and the NMOS transistor 14. When the circuit is at a sourcing mode, the 5 V bias from the output pad 10 goes through the PMOS transistors 11, 12. When the circuit is at a sinking mode, the 5 V bias from the output pad 10 goes through the NMOS transistors 13, 14. The circuit shown in FIG. 1 can effectively solve the problems of the reliability of the oxide layer and the leakage current of the PMOS transistors 11,12. In other word, the part of IC powered by 3.3 V is not affected by the 5 V bias. Although the problems as described above are solved, the output impedance turns to higher because a necessary rout through the PMOS transistors 11, 12 for the sourcing mode and a necessary rout through the NMOS transistors 13, 14 for the sinking mode. This decreases the transmission speed of voltage source.

FIG. 2 is a schematic block diagram of another conventional I/O circuit, which has been disclosed by TSMC at a U.S. Pat. No. 5,546,019, "CMOS I/O CIRCUIT WITH 3.3 V OUTPUT AND TOLERANCE OF 5 V INPUT".

In FIG. 2, the I/O circuit includes an output pad 20, a pull-up circuit 21, a PMOS transistor 22, two NMOS transistors 23, 24, and a control circuit 25. According the I/O circuit in FIG. 2, a problem of the forward bias on the PN junction of the PMOS transistor 22 can be solved, and by a full swing situation can be achieved by using the pull-up circuit 21. The control circuit 25 is used to control the output at "low" level or "high", which determine the states of the PMOS transistor 21 and the NMOS transistor 23,24 to be either "ON" or "OFF". When the NMOS transistor 24 is "OFF", the NMOS transistor 24 is in a high impedance status and its gate oxide is loaded by 5 V from the output pad 20. So, the oxide layer can potentially be damaged. This gives a poor reliability of the oxide layer.

As described above, the conventional I/O circuits have drawbacks as follows:

1. When an IC needs two different biases, which are supplied from a single bus, even though a dual gate oxide is used to replace a single gate oxide for increasing the breakdown voltage, the fabricating costs is therefore increased.

2. When the I/O circuit is at the sourcing mode or the sinking mode, it needs to go through two PMOS transistors 11, 12 connected serially or two NMOS transistors 13, 14 connected serially, respectively. In this case, the output impedance is increased such that the transmission speed of voltage source is decreased.

3. When the NMOS transistor 24 is "OFF", the NMOS transistor 24 is in a high impedance status and its gate oxide is loaded by 5 V from the output pad 20. So, the gate oxide can potentially be damaged. This gives a poor reliability of the gate oxide.

SUMMARY OF THE INVENTION

It is therefore an objective of the present invention to provide an I/O circuit with wide voltage tolerance, which utilizes a circuitry technology to solve the voltage tolerance for different biases and can be fabricated using single gate oxide structure.

It is another an objective of the present invention to provide an I/O circuit with wide voltage tolerance, which solves poor reliability of the gate oxide, damage of the PN forward junction, and leakage current happening on the PMOS transistors. Moreover, the output impedance is reduced to enhance the transmission speed of voltage source.

In accordance with the foregoing and other objectives of the present invention, an I/O circuit with wide voltage tolerance utilizes a circuitry technology to increase the voltage tolerance for different biases used in an IC device. Only single gate oxide is needed. The reliability of the gate oxide is kept. Both damage of the PN forward junction and leakage current happening on the PMOS transistors are effectively avoided. Moreover, the output impedance is reduced to enhance the transmission speed of voltage source.

The I/O circuit includes an output pad, a feedback circuit, a PMOS gate transistor, an NMOS gate transistor, and a driver. The PMOS and NMOS gate transistors are coupled to the output pad, and are coupled to the driver output through a PMOS transistor and an NMOS transistor. The substrate of the PMOS gate transistor is also internally coupled to the output pad. The feedback circuit is coupled to output pad and the gate of the PMOS gate transistor for keeping the bias difference between the output pad and the gate bias of the PMOS gate transistor to be smaller than the threshold voltage of the PMOS gate transistor.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
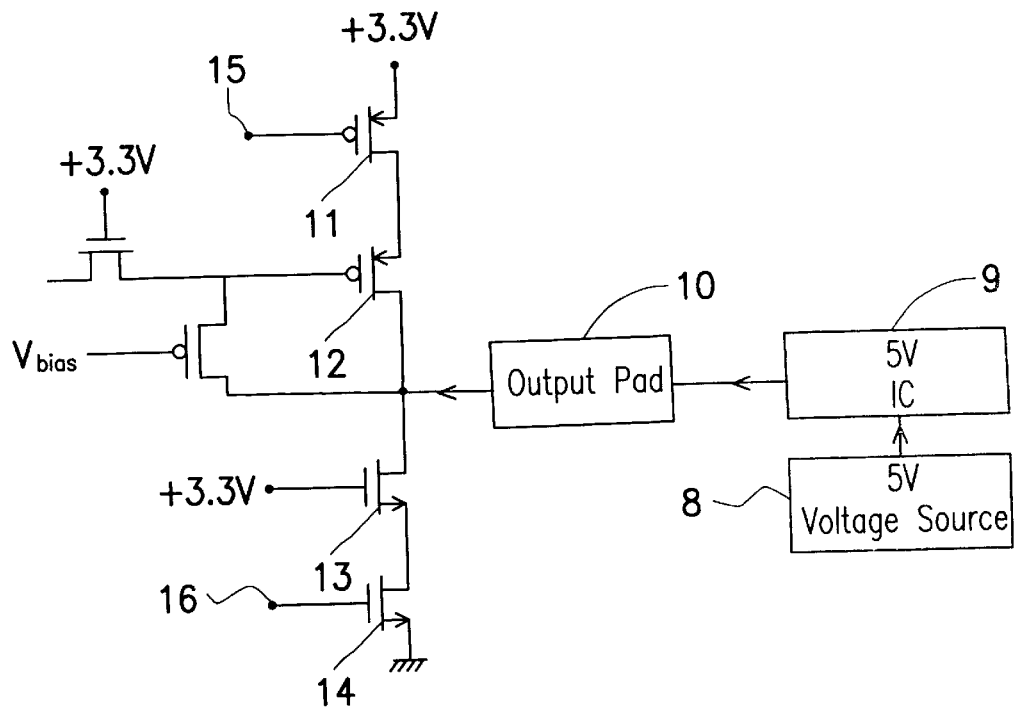
FIG. 1 is a schematic conventional I/O circuit disclosed by AT&T in a U.S. Pat. No. 5,381,062.
Figure 2:
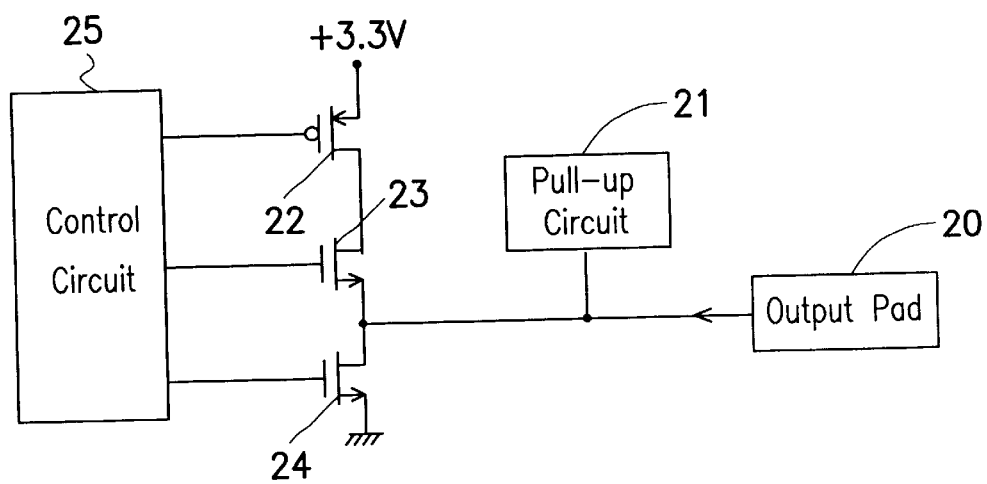
FIG. 2 is a schematic block diagram of another conventional I/O circuit disclosed by TSMC at an U.S. Pat. No. 5,546,019.
Figure 3:
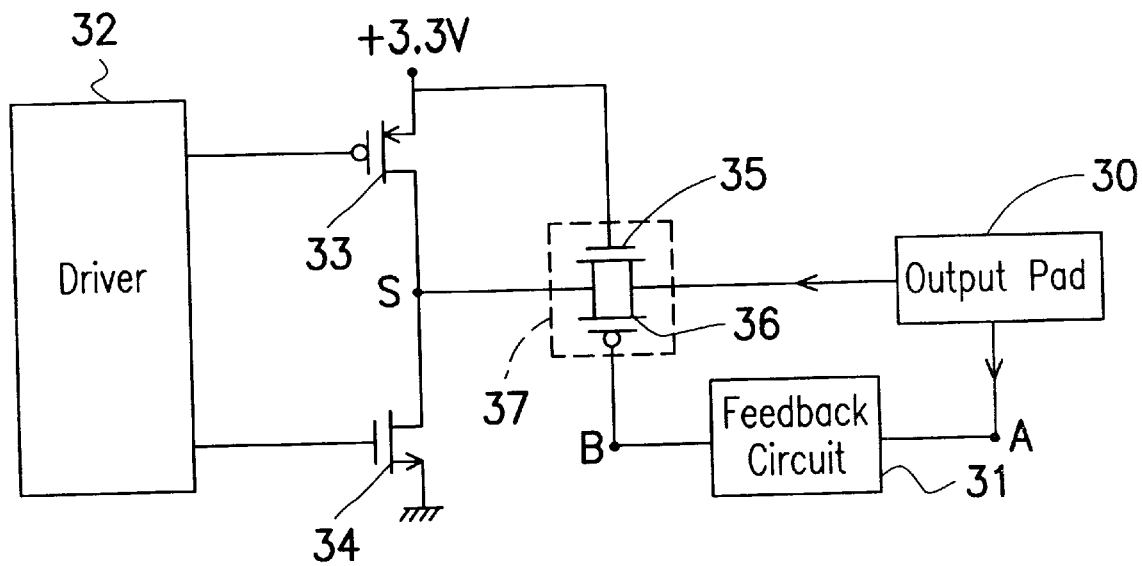
FIG. 3 is a schematic I/O circuit with wide voltage tolerance, according to a preferred embodiment of the invention.
Figure 4:
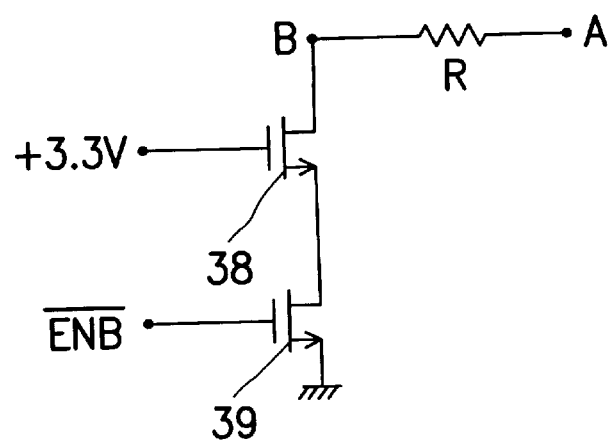
FIG. 4 is a feedback circuit used in FIG. 3 suitable for operating in low frequency.
Figure 5:
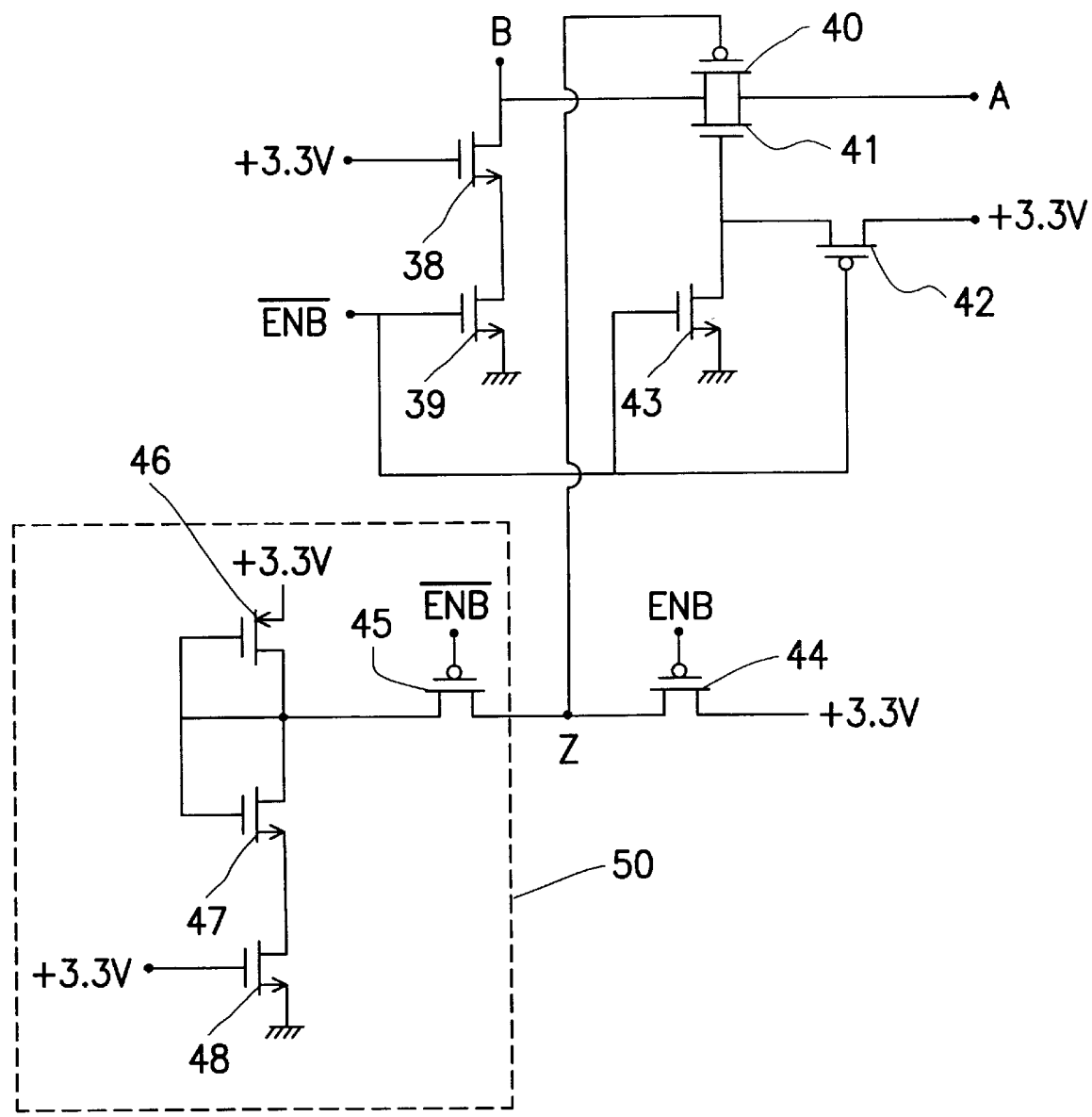
FIG. 5 is a feedback circuit used in FIG. 3 suitable for operating in high frequency.

FIG. 3 is a schematic I/O circuit with wide voltage tolerance, according to a preferred embodiment of the invention. FIG. 4 is a feedback circuit used in FIG. 3 suitable for operating in a low frequency. FIG. 5 is a feedback circuit used in FIG. 3 suitable for operating in a high frequency.

In FIG. 3, an NMOS gate transistor 35 and a PMOS gate transistor 36 are connected in parallel to form a transmission gate means 37, which is coupled to an output pad 30. The substrate (not shown) of the PMOS gate transistor 36 is also internally coupled to the output pad 30. The output pad 30 provides, for example, 5 V bias to the I/O circuit. When I/O circuit is at a sourcing mode, the bias is transmitted through the transmission gate means 37 and a PMOS transistor 33. When I/O circuit is at a sinking mode, the bias is transmitted through the transmission gate means 37 and an NMOS transistor 34. This I/O circuit has only about two third of the output impedance of the conventional I/O circuit so that the transmission speed is about 30% faster than the transmission speed of the conventional one. The PMOS transistor 33 and the NMOS transistor 34 are separately coupled to the output of a driver 32, which yields a "high" or a "low" to either turn on or turn off the PMOS transistor 33 and the NMOS transistor 34. The output pad 30 can be coupled to the part of IC (not shown), which uses a higher bias, such as 5 V. The other part of IC (not shown) uses a lower bias, such as 3.3 V.

Referring to FIG.3 and FIG. 4, a feedback circuit 31 is coupled to the I/O circuit on a node A and a node B. When the driver 32 turns on both the PMOS transistor 33 and the NMOS transistor 34, an enabling signal $\overline{ENB}$ is set at high. So, an NMOS transistor 39 is turned on by the enabling signal $\overline{ENB}$. Since the NMOS transistor 39 is on, the voltage at the node B then is close to the source voltage of the NMOS transistor, which is the ground voltage of 0 V. Therefore, the PMOS transistor 36 is turned on, $(V_g > V_t)$, where $V_g$ is gate voltage $V_t$ is threshold voltage. In this case, the output pad 30 is at full swing to drive the next level IC device.

When the driver 32 turns off the PMOS transistor 33 and the NMOS transistor 34, the enabling signal $\overline{ENB}$ is set at "low". The NMOS transistor 39 is off and the node B is then has the same voltage as the node B through a coupling resistor R. The PMOS transistor 36 then is off, $(V_g < V_t)$. In this case, the voltage at a node S is kept at about 3.3 $V - V_{tN35}$, where the $V_{tN35}$ is the threshold voltage of the NMOS transistor 35.

Referring to FIG.3 and FIG. 5, the feedback circuit show in FIG. 5 is suitable for high frequency operation and is coupled to the I/O circuit at the node A and the node B. The substrate of a PMOS transistor 40 is coupled to the highest bias, such as 5 V, used in the IC device. When the driver 32 turns on the PMOS transistor 33 and the NMOS transistor 34, the enabling signal ENB is set at "low" and the enabling signal $\overline{ENB}$ is set at "high". This NMOS transistor 39 therefore is turned on. Since the NMOS transistor 39 is on, the voltage at the node B then is close to the source voltage of the NMOS transistor, which is the ground voltage of 0 V. Therefore, the PMOS transistor 36 is turned on, $(V_g > V_t)$. In this case, the output pad 30 is at full swing to drive the next level IC device.

When the driver 32 turns off the PMOS transistor 33 and the NMOS transistor 34, the enabling signal $\overline{ENB}$ is set at "low" and the enabling signal ENB is set at "high". The NMOS transistor 39, 43 and the PMOS transistor 44 are at "off". The PMOS transistor 42, 45 are at "on". When the output pad 30 voltage is brought up from 0 V, since the NMOS transistor 35 is turned on, the 3.3 V bias flows to the output pad 30 through the NMOS transistor 35. The node S tracks the output pad 30 voltage $V_{pad}$ until 3.3 V$-V_{tN35}$. When $V_{pad}$>3.3 V$-V_{tN41}$, where the $V_{tN41}$ is the threshold voltage of the NMOS transistor 41, the NMOS transistor 41 is at "off" so that the node B voltage can't reach the node A voltage through the NMOS transistor 41. The node Z voltage then is $V_{dcbias}$ through a bias circuit 50, which is composed of two PMOS transistors 45, 46 and two NMOS transistors 47, 48. When $V_A$>$V_{dcbias}$+$V_{tP40}$, where $V_{tP40}$ is the threshold voltage of the PMOS transistor 40, the PMOS transistor 40 is "on". So, the node B voltage turns to be the same as the node A voltage through the PMOS transistor 40. Therefore, the node B voltage can track the node A voltage to keep the node S voltage from greater than 3.3 V.

According to the above description, the I/O circuit of the invention utilizes the feedback circuit 31 to allow the node A voltage (at high impedance) to be tracked by the node B. When the output pad 30 voltage is greater than 3.3 V, the PMOS transistor 36 is "off" and the node S voltage, which is not changed along with the output pad 30 voltage, is kept at 3.3$-V_{tN35}$ through the NMOS transistor 35. When the output of the 3.3 V IC is at high output impedance, it therefore can endure the stress from the 5 V-voltage source. Because the voltage tolerance of the I/O circuit is enhanced, the reliability of the gate oxide can be kept, and both the damages of the PN forward junction and the leakage current of the PMOS transistor can be avoided.

In conclusion, the advantages of the I/O circuit of the invention are as following:

1. The invention utilizes a circuitry technology to solve the voltage tolerance for different biases. In this case, a single gate oxide structure is fabricated instead of a dual gate oxide structure so that the fabricating costs are brought down.

2. The output impedance is decreased so that the transmission speed is increased about 30%.

3. The problems, such as the reliability of the gate oxide, PN forward junction, and leakage current of the PMOS transistor, are effectively solved.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An input and output (I/O) circuit with wide voltage tolerance, the I/O circuit comprising:

an output pad for receiving a first voltage;

a feedback circuit coupled to the output pad;

a first NMOS transistor, wherein a gate of the first NMOS transistor is for receiving a second voltage;

a first PMOS transistor, wherein a gate of the first PMOS transistor is coupled to the feedback circuit, and the first PMOS transistor is coupled together with the first NMOS transistor in parallel to form a first transmission gate, in which a first I/O terminal of the first transmission gate is coupled to the output pad and a second I/O terminal of the first transmission gate is for outputting a third voltage;

a second PMOS transistor, wherein a source of the second PMOS transistor receives the second voltage, and the drain of the second PMOS transistor is coupled to the second I/O terminal of the first transmission gate;

a second NMOS transistor, wherein a source of the second NMOS transistor is coupled to the drain of the second PMOS transistor and the second I/O terminal of the first transmission gate, and the drain of the second NMOS transistor is grounded;

when the I/O circuit is at an output mode and either of the second PMOS transistor or the second NMOS transistor is "on", the feedback circuit is grounded and causes the output pad at full swing;

when the I/O circuit is at high impedance, both the second PMOS transistor and the second NMOS transistor are "off", and when the first voltage is smaller than the second voltage, the third voltage can track the first voltage through the first NMOS transistor until the third voltage is equal to $V_{2nd}-V_{t-first-NMOS}$, where $V_{2nd}$ is the second voltage and $V_{t-first-NMOS}$ is the threshold voltage of the first NMOS transistor; and when the I/O circuit is at high impedance, both the second PMOS transistor and the second NMOS transistor being "off", and when the first voltage is smaller than the second voltage, the first PMOS is turned off by the feedback circuit, in which the third voltage is kept at the quantity of $V_{2nd}-V_{t-first-NMOS}$ under the control of the first NMOS transistor.

2. The I/O circuit of claim 1, wherein the I/O circuit further comprises a driver, wherein the driver is coupled to the gate of the second NMOS transistor and the gate of the second PMOS transistor for controlling the "on" or "off" of the second NMOS and PMOS transistors.

3. The I/O circuit of claim 1, wherein the feedback circuit comprises:

a resistor serially coupled to the output pad and the gate of the first PMOS transistor;

a third NMOS transistor, wherein a source of the third NMOS transistor is coupled to the gate of the first PMOS transistor, and a gate of the third NMOS transistor is for receiving the second voltage; and a fourth NMOS transistor, in which a source of the fourth NMOS transistor is coupled to a drain of the third NMOS transistor, a gate of the fourth NMOS transistor is for receiving a first enabling signal, and a drain of the fourth NMOS transistor is grounded, wherein when the I/O circuit is at the output mode, the first enabling signal is at "high", which turns on the fourth NMOS transistor, and when the I/O circuit is at high impedance, the first enabling signal is at "low", which turns off the fourth NMOS transistor.

4. The I/O circuit of claim 1, wherein the feedback circuit comprises:

a bias circuit, for providing a fourth voltage;

a third PMOS transistor, in which the gate of the third PMOS transistor is for receiving the fourth voltage;

a fifth NMOS transistor, in which the fifth NMOS transistor is parallel connected with the third PMOS transistor to form a second transmission gate, wherein a first I/O terminal of the second transmission gate is coupled to the output pad;

a sixth NMOS transistor, in which a source of the sixth NMOS transistor is coupled to the gate of the fifth NMOS, a drain of the sixth NMOS transistor is grounded, and a gate of the sixth NMOS transistor is for receiving the first enabling signal;

a fourth PMOS transistor, in which a source of the fourth PMOS transistor is for receiving the second voltage, a drain of the fourth PMOS transistor is coupled to the source of the sixth NMOS transistor, and the gate of the fourth PMOS transistor is for receiving the first enabling signal;

a fifth PMOS transistor, in which a gate of the fifth PMOS transistor is for receiving a complementary enabling signal of the first enabling signal, a source of the fifth PMOS transistor for receiving the second voltage, and a drain of the fifth PMOS transistor is for receiving the fourth voltage;

a seventh NMOS transistor, in which a source of the seventh transistor is coupled to a second I/O terminal of the second transmission gate output and the gate of the first PMOS transistor, a gate of the seventh transistor is for receiving the second voltage; and a eighth NMOS transistor, in which a source of the eighth NMOS transistor is coupled to a drain of the seventh NMOS transistor, a gate of the eighth NMOS transistor is for receiving the first enabling signal, a drain of the eighth NMOS transistor is grounded, wherein when the I/O circuit is at the output mode, the first enabling signal is at "high", which turns on the eighth NMOS transistor, and when the I/O circuit is at high impedance, the first enabling signal is at "low", which turns off the eighth NMOS transistor.

* * * * *